United States Patent
Webster

(10) Patent No.: US 9,524,357 B1
(45) Date of Patent: Dec. 20, 2016

(54) SYSTEMS, METHODS AND APPARATUS FOR GENERATING AND MODIFYING SUPPORT STRUCTURES

(71) Applicant: Clayton P. Webster, Cincinnati, OH (US)

(72) Inventor: Clayton P. Webster, Cincinnati, OH (US)

(73) Assignee: Simplify3D LLC, Blue Ash, OH (US)

( * ) Notice: Subject to any disclaimer, the term of this patent is extended or adjusted under 35 U.S.C. 154(b) by 0 days.

(21) Appl. No.: 14/499,389

(22) Filed: Sep. 29, 2014

Related U.S. Application Data

(60) Provisional application No. 61/894,067, filed on Oct. 22, 2013.

(51) Int. Cl.
*G06F 17/50* (2006.01)
*B29C 67/00* (2006.01)

(52) U.S. Cl.
CPC ........... *G06F 17/50* (2013.01); *B29C 67/0088* (2013.01)

(58) Field of Classification Search
CPC ................................ G06F 17/05; G06T 17/00
USPC ............................................... 700/98; 264/75
See application file for complete search history.

(56) References Cited

U.S. PATENT DOCUMENTS

| | | | |
|---|---|---|---|
| 5,182,056 A | 1/1993 | Spence et al. | |
| 5,764,521 A | 6/1998 | Batchelder et al. | |
| 6,923,634 B2 | 8/2005 | Swanson et al. | |
| 7,122,246 B2 | 10/2006 | Comb et al. | |
| 7,785,093 B2 | 8/2010 | Holmboe et al. | |
| 2007/0003656 A1 | 1/2007 | LaBossiere et al. | |
| 2007/0228590 A1 | 10/2007 | LaBossiere et al. | |
| 2008/0213419 A1 | 9/2008 | Skubic et al. | |
| 2009/0035405 A1 | 2/2009 | Leavitt | |
| 2009/0263582 A1 | 10/2009 | Batchelder | |
| 2010/0096485 A1 | 4/2010 | Taatjes et al. | |
| 2010/0096489 A1 | 4/2010 | Taatjes et al. | |

OTHER PUBLICATIONS

Kevvox, K-Studio Software marketing video Published Feb. 24, 2013 http://www.youtube.com/watch?v=QzNDtwTYLMo or http://kevvox.com/3d-printers/software.*

"K-Studio User's Manual" by Kevvox, updated May 8, 2013, Accessed at http://www.neogrouplimited.com/index.php/client-service/downloads-zone/neogroup-support/download?id=25&id_version=32.*

Kirschman et al., "Computer Aided Design of Support Structures for Stereolithographic Components" Proceedings of 1991 ASME Computers in Engineering Conference 1991. pp. 1-15.*

(Continued)

*Primary Examiner* — Mohammad Ali
*Assistant Examiner* — Emilio J Saavedra
(74) *Attorney, Agent, or Firm* — Ulmer & Berne LLP

(57) ABSTRACT

Systems and methods for generating data for a support structure to be built with a digital manufacturing system. Virtual rays are generated that extend toward a digital representation of a three-dimensional model. Intersection points of the virtual rays and the outer surface of the three-dimensional model are determined. Support structures extending from the outer surface of the three-dimensional model at the intersection point are generated. Support structure requirements can be used to determine if a support structure should be generated. A user can alter the support structures prior to the building of the three-dimensional model.

23 Claims, 11 Drawing Sheets

(56) References Cited

OTHER PUBLICATIONS http://www.3ders.org/articles/20130301-new-kevvox-dlp-3d-printers-available-for-australia-and-new-zealand-market.html Published Mar. 1, 2013.*

3D Printing Systems (Smart Support) https://web.archive.org/web/20121004230933/http://3dprintingsystems.com/products/up-mini-3d-printer Oct. 4 2012.*

Pham et al., "Part Orientation in Stereolithography" International Journal of Advanced Manufacturing Technology (1999) Issue 15. pp. 674-682.*

Fickenscher, "Using Voxelization and Ray-Tracing to Identify Wall Thinness of Polygonal Models" Dec. 2008, pp. 1-46.*

Allen et al., "Determination and evaluation of support structures in layered manufacturing" Journal of Design and Manufacturing; 5, 3; pp. 153-162; Journal of Design and Manufacturing; 1995.*

\* cited by examiner

_US 9,524,357 B1_

SYSTEMS, METHODS AND APPARATUS FOR GENERATING AND MODIFYING SUPPORT STRUCTURES

CROSS-REFERENCE TO RELATED APPLICATION

This application claims the benefit of U.S. provisional patent application Ser. No. 61/894,067, filed on Oct. 22, 2013, entitled, SYSTEMS, METHODS AND APPARATUSES FOR GENERATING AND MODIFYING SUPPORT STRUCTURES, the disclosure of which is hereby incorporated by reference in its entirety.

TECHNICAL FIELD

The systems, methods and apparatuses described below relate generally to the field of manufacturing systems for building three-dimensional (3D) models. More particularly, the systems, methods and apparatuses relate to the field of generating support structures for use with 3D models in additive manufacturing systems.

BACKGROUND

Additive manufacturing systems based on deposition or cured liquid resins are capable of fabricating 3D digital models by simplifying them into stacked layer profiles. For deposition-based systems, these stacked layers can be created using a heated nozzle that deposits a thin layer of liquid thermoplastic material. Once the current layer has cooled and partially solidified, the nozzle moves upward to the next stacked layer and the process repeats. For cured resin systems, an accurately controlled laser can be used to solidify liquid photopolymers using a similar layering strategy. In both manufacturing techniques, an upper-most stacked layer relies on support from the layer or layers directly below it to maintain desired part shape. If this support is not provided, the unsupported layer may shift in position or deform due to the partially pliable state of the material. In an attempt to mitigate or at least reduce the shifting of layers during the manufacturing process, supportive structures can be added to the 3D model at strategic locations. For example, supportive structures can be incorporated into portions of a 3D model that have an overhanging section that may not be adequately supported by the lower layers. These supportive structures can be removed from the 3D model subsequent to manufacturing.

BRIEF DESCRIPTION OF THE DRAWINGS

It is believed that certain embodiments will be better understood from the following description taken in conjunction with the accompanying drawings, in which like references indicate similar elements and in which.

DETAILED DESCRIPTION

Figure 1:
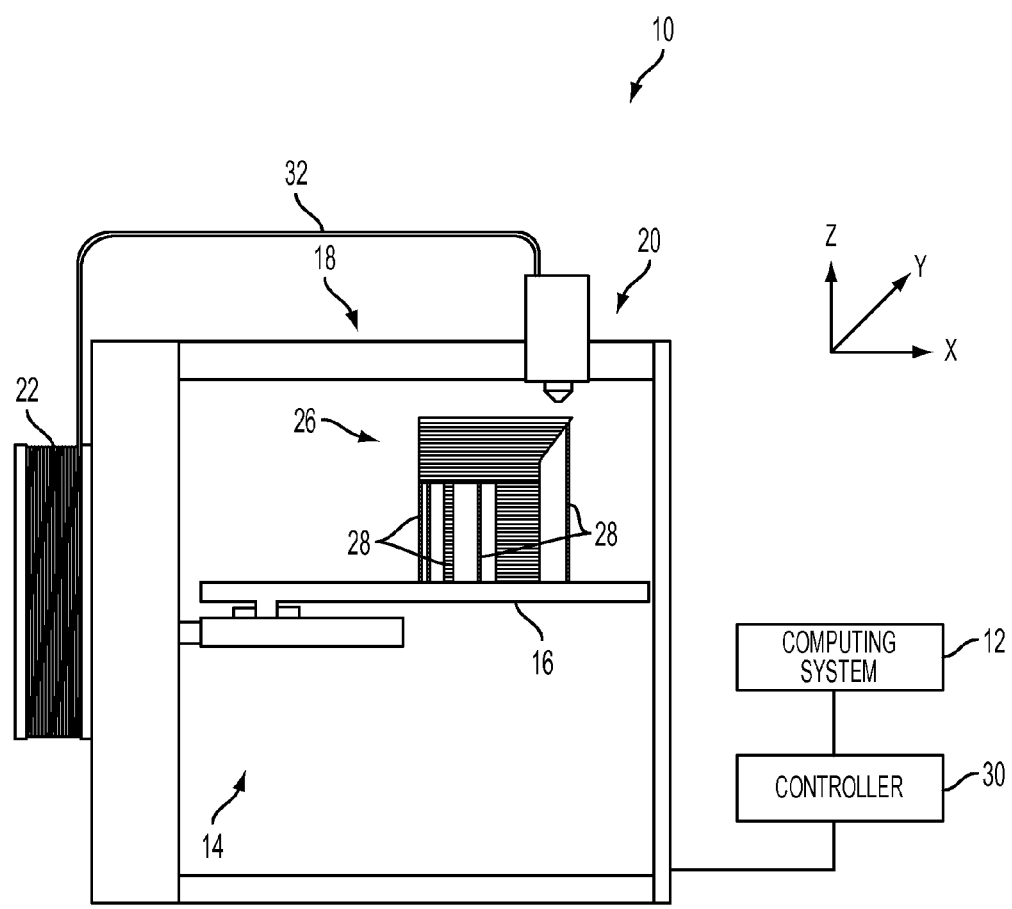
FIG. 1 is a front view of an extrusion-based digital manufacturing system for building 3D models and support structures, where the support structures are generated pursuant to a support structure generation technique of the present disclosure.

Various non-limiting embodiments of the present disclosure will now be described to provide an overall understanding of the principles of the structure, function, and use of systems and methods disclosed herein for the generation and control of support material for use in the fabrication of 3D models. One or more examples of these non-limiting embodiments are illustrated in the selected examples disclosed and described in detail with reference made to FIGS. 1-15 in the accompanying drawings. Those of ordinary skill in the art will understand that systems and methods specifically described herein and illustrated in the accompanying drawings are non-limiting embodiments. The features illustrated or described in connection with one non-limiting embodiment may be combined with the features of other non-limiting embodiments. Such modifications and variations are intended to be included within the scope of the present disclosure.

The systems, apparatuses, devices, and methods disclosed herein are described in detail by way of examples and with reference to the figures. The examples discussed herein are examples only and are provided to assist in the explanation of the apparatuses, devices, systems and methods described herein. None of the features or components shown in the drawings or discussed below should be taken as mandatory for any specific implementation of any of these systems, apparatuses, devices, or methods unless specifically designated as mandatory. For ease of reading and clarity, certain components, modules, or methods may be described solely in connection with a specific figure. In this disclosure, any identification of specific techniques, arrangements, etc. are either related to a specific example presented or are merely a general description of such a technique, arrangement, etc. Identifications of specific details or examples are not intended to be, and should not be, construed as mandatory or limiting unless specifically designated as such. Any failure to specifically describe a combination or sub-combination of components should not be understood as an indication that any combination or sub-combination is not possible. It will be appreciated that modifications to disclosed and described examples, arrangements, configurations, components, elements, apparatuses, devices, systems, methods, etc. can be made and may be desired for a specific application. Also, for any methods described, regardless of whether the method is described in conjunction with a flow diagram, it should be understood that unless otherwise specified or required by context, any explicit or implicit ordering of steps performed in the execution of a method does not imply that those steps must be performed in the order presented but instead may be performed in a different order or in parallel.

Reference throughout the specification to "various embodiments," "some embodiments," "one embodiment," "some example embodiments," "one example embodiment," or "an embodiment" means that a particular feature, structure, or characteristic described in connection with any embodiment is included in at least one embodiment. Thus, appearances of the phrases "in various embodiments," "in some embodiments," "in one embodiment," "some example embodiments," "one example embodiment, or "in an embodiment" in places throughout the specification are not necessarily all referring to the same embodiment. Furthermore, the particular features, structures or characteristics may be combined in any suitable manner in one or more embodiments.

Throughout this disclosure, references to components or modules generally refer to items that logically can be grouped together to perform a function or group of related functions. Like reference numerals are generally intended to refer to the same or similar components. Components and modules can be implemented in software, hardware, or a combination of software and hardware. The term "software" is used expansively to include not only executable code, for example machine-executable or machine-interpretable instructions, but also data structures, data stores and computing instructions stored in any suitable electronic format, including firmware, and embedded software. The terms "information" and "data" are used expansively and include a wide variety of electronic information, including executable code; content such as text, video data, and audio data, among others; and various codes or flags. The terms "information," "data," and "content" are sometimes used interchangeably when permitted by context. It should be noted that although for clarity and to aid in understanding some examples discussed herein might describe specific features or functions as part of a specific component or module, or as occurring at a specific layer of a computing device (for example, a hardware layer, operating system layer, or application layer), those features or functions may be implemented as part of a different component or module or operated at a different layer of a communication protocol stack. Those of ordinary skill in the art will recognize that the systems, apparatuses, devices, and methods described herein can be applied to, or easily modified for use with, other types of equipment, can use other arrangements of computing systems such as client-server distributed systems, and can use other protocols, or operate at other layers in communication protocol stacks, than are described.

The present disclosure is generally directed to support structure generation and management techniques for use with 3D models. As described below, various types of support structures can be generated underneath overhanging portions or in cavities of a 3D model which are not supported by modeling material itself. Further, prior to manufacturing the 3D model with a manufacturing system, the generated support structures can be selectively altered or removed, and additional support structures can be added to the 3D model, through various user interactions with a graphical user interface.

FIG. 1 is a front view of system 10 in use with a computing system 12, where the system 10 is deposition-based digital manufacturing system that can be used to build 3D models with support structures generated pursuant to the technique of the present disclosure. Suitable deposition-based digital manufacturing systems include extrusion-based systems, such as fused deposition modeling (FDM) systems developed by MakerGear LLC, Beachwood, Ohio, among others. While an FDM system is shown in FIG. 1, a variety of other types of manufacturing systems can be utilized without departing from the scope of the present disclosure. For example, in some embodiments stereolithography (SLA) systems that utilize photopolymers cured with a laser or other illuminating devices can be used to build 3D models with support structures. Additional details regarding example SLA systems can be found in U.S. Pat. Nos. 5,182,056 and 7,785,093, both of which are herein incorporated by reference in their entirety.

Referring still to FIG. 1, the computing system 12 can include one or more computer-based systems that communicate with the system 10, and can be separate from the system 10, or alternatively can be an internal component of the system 10. As discussed below, the computing system 12 can generate data, such as tool paths, for building 3D models. The computing system 12 can also generate support structures for incorporation into the 3D model, and allow for user control and interaction with the support structures, pursuant to the support structure generation technique of the present disclosure.

In the illustrated embodiment, the system 10 is an extrusion-based system that includes a build chamber 14, a platen 16, a gantry 18, an extrusion head 20, and a supply source 22. While the system 10 is shown having one supply source 22, other embodiments can have more than one supply source. The build chamber 14 can be an open or closed environment that contains the platen 16, the gantry 18, and the extrusion head 20 for building a 3D model (shown as 3D model 26) and a corresponding support structures (shown as support structures 28). The platen 16 is a platform on which the 3D model 26 and the support structure 28 are built, and moves along a vertical z-axis based on signals (e.g., instructions) provided from a controller 30. The controller 30 may direct the motion of the platen 16 and/or the extrusion head 20 based on data supplied by computing system 12.

In the illustrated embodiment, the gantry 18 is a guide rail system configured to move the extrusion head 20 in a horizontal x-y plane within the build chamber 14 based on signals provided from controller 30. The horizontal x-y plane is a plane defined by an x-axis and a y-axis, where the x-axis, the y-axis, and the z-axis are orthogonal to each other. In an alternative embodiment, the platen 16 may be configured to move in the horizontal x-y plane within build chamber 14, and the extrusion head 20 may be configured to move along the z-axis. Other similar arrangements may also be used such that one or both of the platen 16 and the extrusion head 20 are moveable relative to each other. As is to be appreciated by those skilled in the art, the present disclosure for generating and managing support structures can be used with a wide variety of manufacturing systems.

The extrusion head 20 is supported by the gantry 18 for building the 3D model 26 and the support structure 28 on the platen 16 in a layer-by-layer manner, based on signals provided from controller 30. Accordingly, the controller 30 also directs the extrusion head 20 to selectively deposit the modeling and support materials based on data supplied by the computing system 12. In the embodiment shown in FIG. 1, extrusion head 20 is a single-tip extrusion head configured to deposit modeling and support materials from supply source 22.

Examples of suitable extrusion heads for extrusion head 20 include those disclosed in LaBossiere, et al., U.S. Patent Application Publication Nos. 2007/0003656 and 2007/

00228590; and Leavitt, U.S. Patent Application Publication No. 2009/0035405, all of which are incorporated herein by reference. Alternatively, system 10 may include one or more two-stage pump assemblies, such as those disclosed in Batchelder et al., U.S. Pat. No. 5,764,521; and Skubic et al., U.S. Patent Application Publication No. 2008/0213419, both of which are incorporated herein by reference. Furthermore, the system 10 may include a plurality of extrusion heads 20 for depositing modeling and/or support materials.

Manufacturing material may be provided to the extrusion head 20 from the supply source 22 through the pathway 32. In some embodiments, model material is sourced from a first supply source of the system 10 and the support material is sourced from a second supply source of the system 10. As is to be appreciated, the system 10 may also include additional drive mechanisms (not shown) configured to assist in feeding the modeling and support materials from the supply source.

Manufacturing material(s) may be provided to the system 10 in a variety of different media. For example, the manufacturing material may be provided as continuous filaments fed from the supply source, as disclosed in Swanson et al., U.S. Pat. No. 6,923,634; Comb et al., U.S. Pat. No. 7,122, 246; and Taatjes et al, U.S. Patent Application Publication No. 2010/0096489 and US2010/0096485, all of which are incorporated herein by reference. Examples of suitable average diameters for the filaments of the modeling and support materials range from about 1.27 millimeters (about 0.050 inches) to about 3.25 millimeters (about 0.128 inches), with particularly suitable average diameters ranging from about 1.75 millimeters (about 0.069 inches) to about 3.00 millimeters (about 0.118 inches). Alternatively, the modeling and support materials may be provided as other forms of media (e.g., pellets and resins) from other types of storage and delivery components (e.g., supply hoppers and vessels).

Suitable modeling materials for building the 3D model 26 include materials having amorphous properties, such as thermoplastic materials, amorphous metallic materials, and combinations thereof. Examples of suitable thermoplastic materials include acrylonitrile-butadiene-styrene (ABS) copolymers, polylactic acids or polylactides (PLA), polycarbonates, polysulfones, polyethersulfones, polyphenylsulfones, polyetherimides, amorphous polyamides, modified variations thereof (e.g., ABS-M30 copolymers), polystyrene, and blends thereof. Examples of suitable amorphous metallic materials include those disclosed in U.S. Patent Application Publication No. US2009/0263582, which is incorporated herein by reference. Additional examples of manufacturing materials include light-cured liquid resins (e.g., photopolymers) which can have a wide range of chemical makeup, as is known in the art. Some embodiments can utilize UV photopolymers, while other can use liquid resins that are cured by exposure to other specific wavelengths. Suitable support materials for building the support structure 28 include materials having amorphous properties (e.g., thermoplastic materials) and that are desirably removable from the corresponding modeling materials after the 3D model 26 and the support structure 28 are built. In some systems, the support material and the model material is the same material. In other systems, such as systems having multiple supply sources, the support material and the model material are different materials.

During a build operation, the controller 30 directs one or more drive mechanisms (not shown) to feed the material to the extrusion head from the supply source 22. For each layer, the controller 30 then directs the gantry 18 to move the extrusion head 20 around in the horizontal x-y plane within the build chamber 14 based on the data (e.g., tool paths) generated by the computing system 12. The materials are then deposited onto the platen 16 to build the layer of the 3D model 26 and the support structure 28 using the layer-based additive technique. The support structure 28 can be deposited to provide vertical support along the z-axis for overhanging regions of the layers of the 3D model 26, as shown in FIG. 1. After the build operation is complete, the resulting 3D model 26 with its support structure 28 may be removed from the build chamber 14, and the support structure 28 may be removed from 3D model 26.

Figure 2:
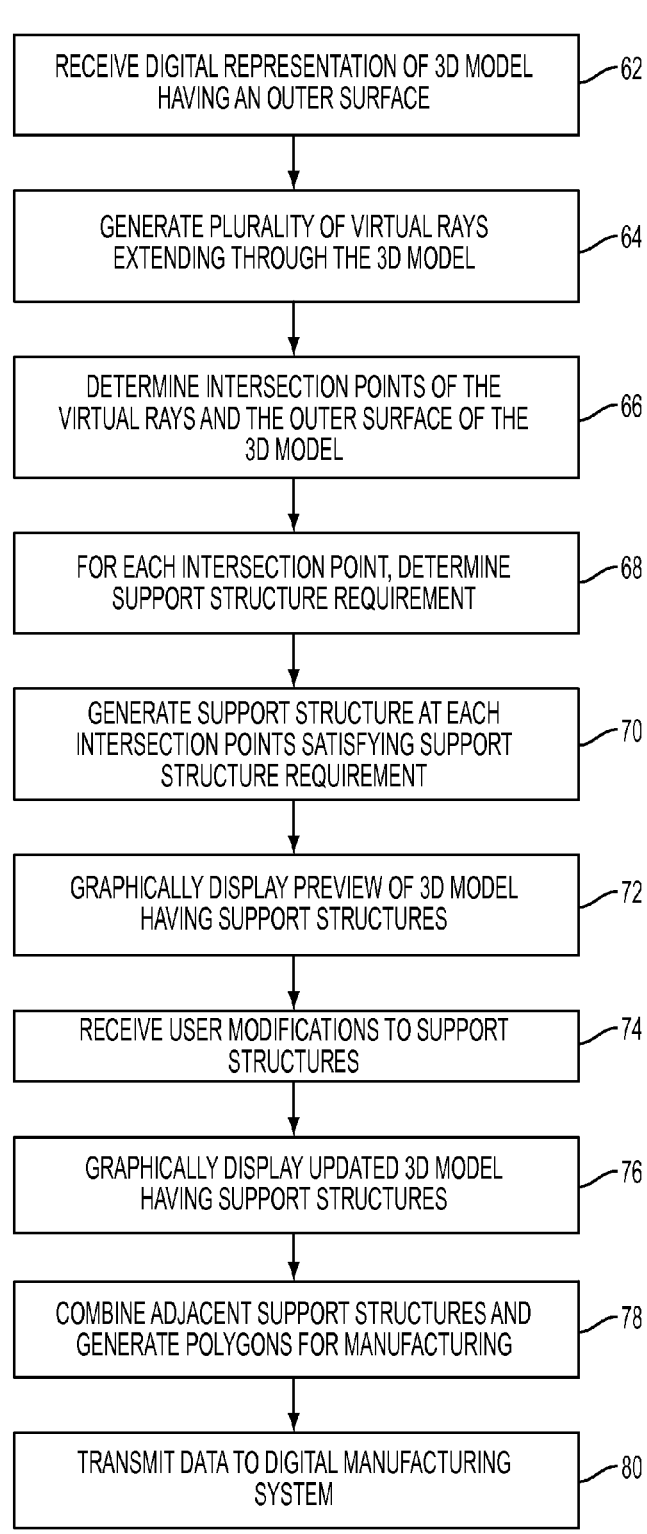
FIG. 2 is a flow diagram of a method for generating data of a 3D model and a corresponding support structure.

FIG. 2 is a flow diagram of method 60 for generating data of a 3D model and corresponding support structure with the computing system 12, where the generated data may be subsequently used to build the 3D model and support structure in a deposition-based digital manufacturing system (such as system 10 of FIG. 1), an SLA system, or any other suitable type of digital manufacturing system. The method 60 is an example of a suitable method that incorporates the support structure generation technique of the present disclosure for generating support structures for 3D models having overhanging or otherwise structurally unsupported portions. The following discussion of method 60 is made with reference to 3D model 100 and support structures 116, as shown in FIGS. 3-6. However, the method 60 is applicable for building 3D models and corresponding support structures having a variety of different geometries, and with a variety of different deposition-based manufacturing systems and liquid resin-based manufacturing systems.

Figure 3:
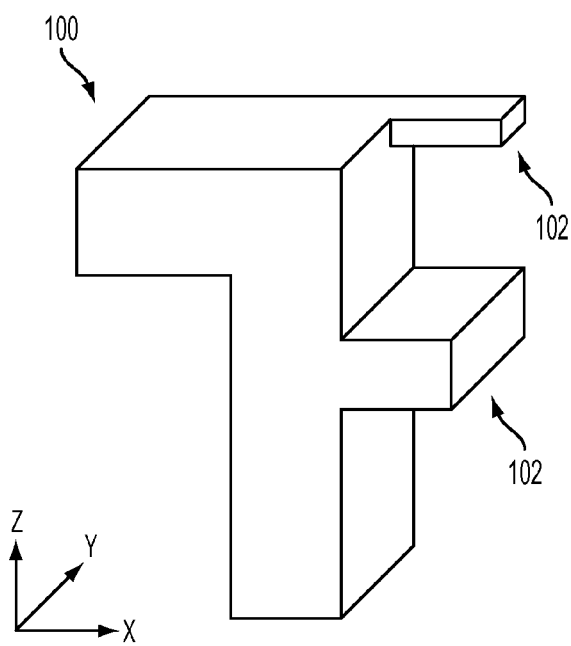
FIG. 3 is an example 3D model before support structures have been generated.

Referring now to FIG. 2, at step 62, a digital representation of 3D model 100 (FIG. 3) having an outer surface is received at a computing system. As shown in FIG. 3, the 3D model 100 can have unsupported portions, generally shown as overhangs 102. Generally, overhangs 102 can include any portion of the 3D model 100 that is not supported by a lower layer, such that the overhang 102 may have the tendency to deform or collapse during a manufacturing process.

Figure 4:
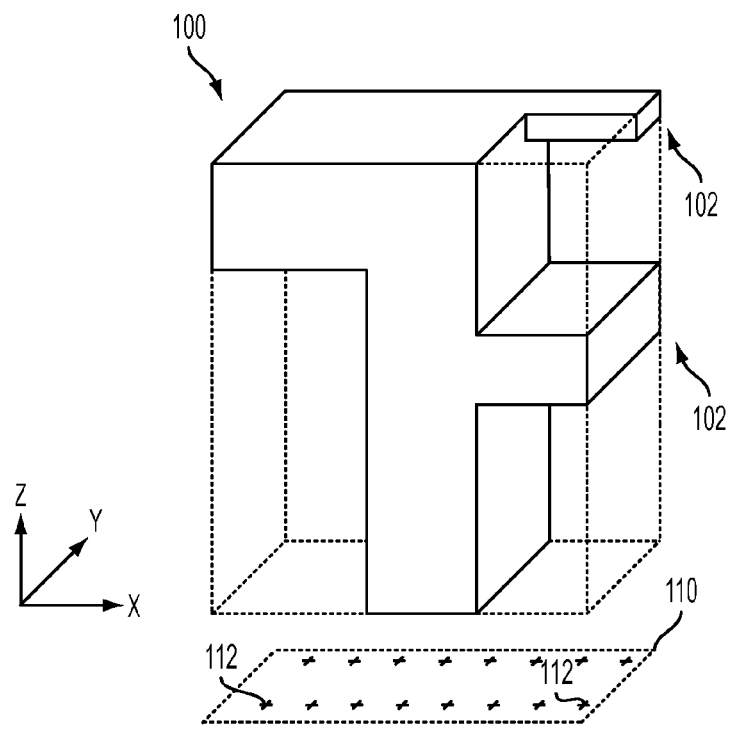
FIG. 4 depicts a footprint of a 3D model having ray origins.
Figure 5:
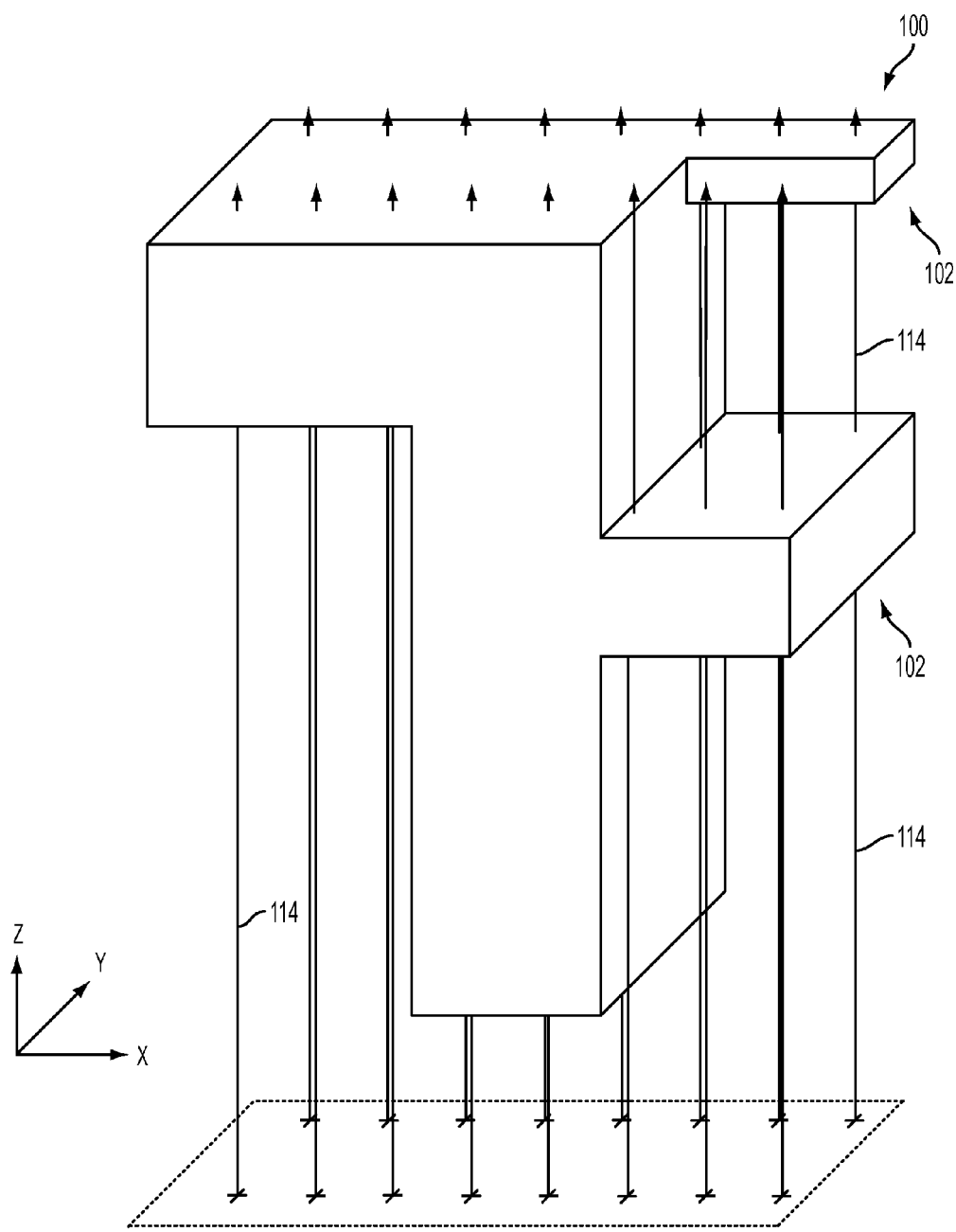
FIG. 5 depicts virtual rays extending through a 3D model and intersecting with an outer surface of the 3D model.

At step 64, a plurality of virtual rays are generated that extend through the 3D model. FIGS. 4-5 illustrate an example generation of virtual rays in accordance with one non-limiting embodiment. Referring first to FIG. 4, a model footprint 110 is determined based on the outermost dimensions of the 3D model 100 in the x-y plane. Ray origins 112 positioned within the model footprint 110 are schematically illustrated in FIG. 4. The ray origins 112 are oriented in a grid pattern. The ray origins 112 can have a ray origin density, as quantified by the number of ray origins 112 per a unit of area. The ray origin density can vary and can be based on a number of parameters, such as the physical size of the 3D model 100, type of support material being used, size of the support structures, 3D model complexity, and so forth. In some embodiments, the ray origin density (i.e. resolution), or other configurations of the ray origins 112, can be modified by a user interacting with the computing system 12. While the ray origin density can vary, in some embodiments the ray origin density ranges from about 10 rays/in$^2$ to about 600 rays/in$^2$.

Referring now to FIG. 5, a plurality of virtual rays 114 that are shown extending through the 3D model 100. While FIG. 5 illustrates the virtual rays 114 extending upward in the z-direction, other configurations can be used without departing from the scope of the current disclosure. For example, in one embodiment, virtual rays 114 originate from "above" the 3D model 100 and extend downward through the 3D model 100. Additionally, while the plurality of virtual rays 114 of FIG. 5 are parallel to each other and normal to the x-y plane, this disclosure is not so limited. The virtual ray configuration may also differ based on the type of manufacturing system being used. With respect to liquid resin-based manufacturing systems, for example, the system 10 can generate a plurality of virtual rays 114 extending from local minima positions on the 3D model 100 that travel downward and intersect with a build platform base or the part below it (whichever comes first).

At step 66 of FIG. 2, the intersection points of the virtual rays 114 and the outer surface of the 3D model 100 are identified. As shown in FIG. 5, some of the virtual rays 114 intersect the overhangs 102 of the 3D model 100.

At step 68, for each intersection point, a support structure requirement is determined by the computing system 12. The support structure requirement can be based on one or more parameters. In one embodiment, for example, the support structure requirement can be based on an angle formed between (1) the virtual ray 114 and (2) a normal vector extending from the surface of the 3D model 100 at the intersection point. If the angle is beneath a given threshold, a support structure can be required at that intersection point. If the angle is above the given threshold, support structure is not required at the intersection point. Additional details regarding the angular thresholds are provided below with regard to FIGS. 12-13. Other parameters can additionally or alternatively be used to determine the support structure requirement at the individual intersection points. At step 70, the computing system 12 generates support structures 116 at each intersection point that satisfy the support structure requirement.

Figure 6:
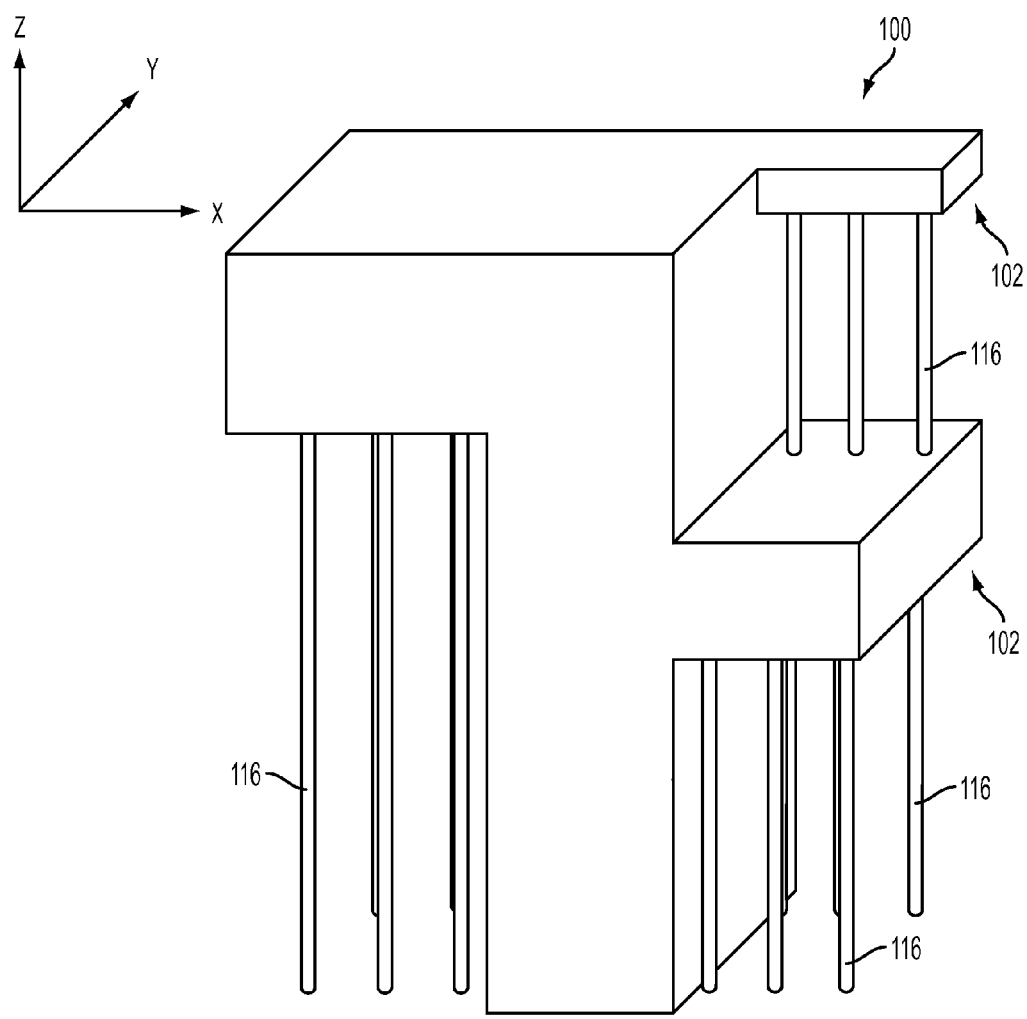
FIG. 6 depicts a 3D model subsequent to the generation of a plurality of support structures.

At step 72, a preview of the 3D model 100 having support structures 116 is graphically displayed to the user. FIG. 6 depicts the 3D model 100 subsequent to the generation of a plurality of support structures 116. As shown, some of the support structures 116 are positioned between an overhang 102 and the "ground", while other of the support structures 116 are positioned between an overhang and another portion of the 3D model 100. At step 74, user modifications to the support structures 116 can be received. In some embodiments, user modifications include the addition of a support structure, the removal of a support structure, the grouping of support structures, the ungrouping of support structures, and/or changing the size, shape or other physical characteristics of a support structure. Example user modifications are described in more detail below with regard to FIGS. 14A-14E. In some embodiments, the grouping of a plurality of support structures into a unitary support structure can be intelligently performed by the computer computing system 12 based on bundling parameters. Additionally or alternatively, a user can selectively bundle neighboring support structures through interactions with the computing system 12.

At step 76, an updated 3D model based on the user modifications is displayed. Upon acceptance by a user, at step 78 the 3D model and support material can be converted into their corresponding polygon outlines for layer-based fabrication. In some embodiments, support material in close proximity can be intelligently grouped or bundled so that a single undivided region of support material can support a plurality of support regions. For a given slice layer, the layer will include a list of polygons representing the support material and the list of polygons for the 3D model outline. Tool path instructions for an extrusion head, a light source (i.e., a laser), or other manufacturing component, among other manufacturing parameters can be determined. At step 80, the data can be transmitted to a digital manufacture system.

In some embodiments, subsequent to any user modification to the support structures, the support material polygons can also be post-processed by computing the convex hull or by applying other types of polygon simplification algorithms. A boundary polygon of the 3D model can then be subtracted from the final support material polygons to avoid intersections with the desired part outline. In some embodiments, a negative polygon offset can be applied to the support material polygons if additional separation from the 3D model is desired for easy removal of the support structure material subsequent to manufacturing.

Figure 7A:
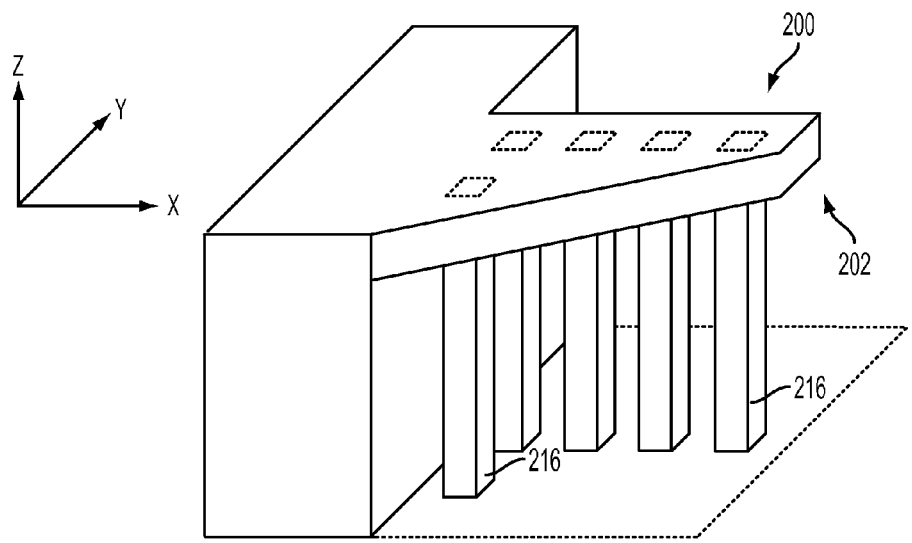
FIG. 7A is a perspective view of a 3D model having support structures.
Figure 7B:
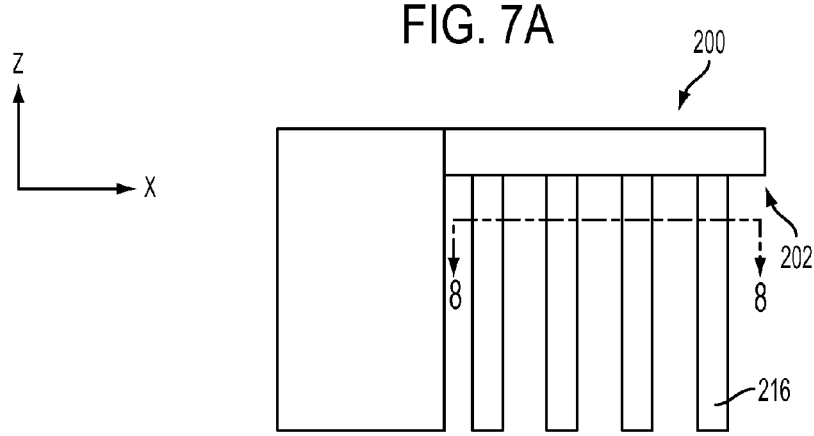
FIG. 7B is a front view of the 3D model of FIG. 7A.
Figure 8:
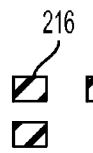
FIG. 8 is a cross-sectional view of FIG. 7B taken along line 8-8.
Figure 10:
FIGS. 9-11 depict example cross-sectional views of support structures.
Figure 9:
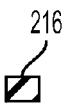
Figure 11:
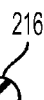

FIG. 7A is a perspective view of a 3D model 200 having an overhang 202 and support structures 216 generated in accordance with the systems and methods described herein. FIG. 7B is a front view of the 3D model 200 of FIG. 7A. FIG. 8 is a cross-sectional view of FIG. 7B taken along line 8-8. While the support structures 216 are illustrated as being rectangular, this disclosure is not so limited. Instead, the support structures 216 can have any suitable shape or configuration. For example, the portion of the support structure 216 proximate to the intersecting point of the 3D model 200 can be cone-shaped or pyramidal-shaped to reduce costs and ease in the separation of the support structure 216 from the 3D model 200 subsequent to manufacturing. FIGS. 9-11 depict example cross-sectional views of structural supports 216 that can be used with the 3D model 200 of FIGS. 7A-7B. As shown in FIG. 9, the support structures 216 can be grouped or bundled to form unitary support structure 216. FIG. 10 illustrates the support structures 216 can have circular cross-sectional areas. FIG. 11 illustrates the grouping of individual support structures into two unitary support structures 216. While various cross-sectional views are illustrated, it is to be appreciated that the support structures can have a wide variety of different cross-sectional shapes. Additional example cross-sectional shapes of support structures include triangular, "X" shaped, "L" shaped, "U" shaped, trapezoidal shaped, or any other suitable closed polygon shaped. Furthermore, support structures can have different cross-sectional shapes at different points along its Z-axis. For example, in accordance with one embodiment, a support structure can have an "X" shaped cross-sectional area at a portion that is proximate to the platen of a manufacturing system and transition to a circular cross-sectional shape at a portion that is proximate to the support structure's interface with the 3D model 200. In one embodiment, a user can toggle between the support structures 216 shown in FIGS. 8-11, among others, prior to transmitting data to the digital manufacturing system through user interactions with a graphical user interface.

In one embodiment, the ultimate configuration of the support structures for a 3D model is determined based purely on the recommendations of the computing system 12 resulting from the virtual ray-based analysis. In another embodiment, the ultimate configuration of the support structure for a 3D model is determined based both on the recommended support structures by the computing system 12 as well changes to the recommended support structures by a user interacting with the computing system 12. In yet another embodiment, the ultimate configuration of the support structure for a 3D model is determined purely on a user interacting with the computing system 12 to identify the placement location and configuration of support structures.

Figure 12:
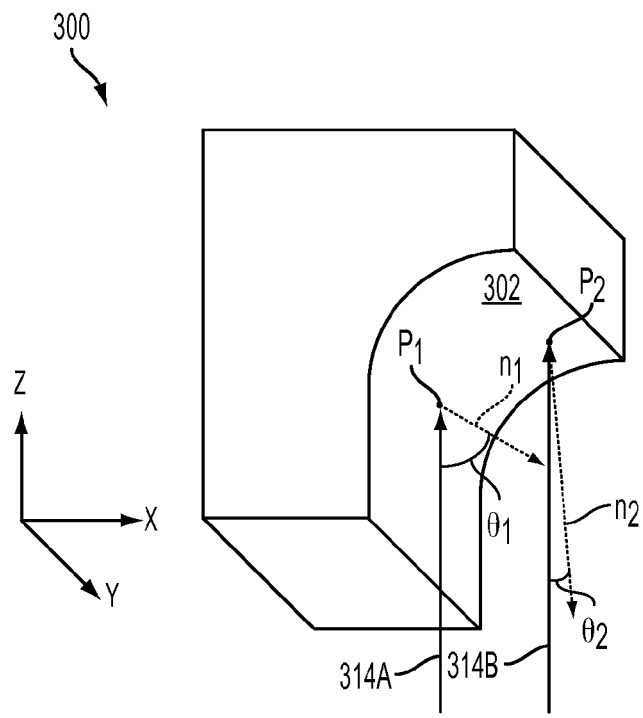
FIG. 12 schematically depicts the interaction between virtual rays and a surface of a 3D model during the structural support generation process.
Figure 13:
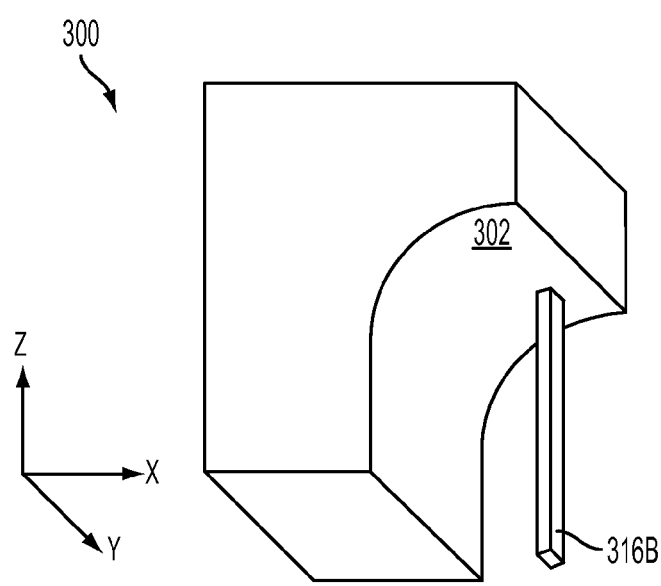
FIG. 13 schematically depicts the 3D model of FIG. 12 subsequent to the generation of a support structure.

FIG. 12 and FIG. 13 schematically depict the interaction between virtual rays 314A, 314B and a surface 302 of a 3D model 300 during the structural support generation process. The characteristics of this interaction can be used by a computing system (such as computing system 12) to determine if a support structure(s) may be required. Referring first to FIG. 12, a virtual ray 314A is shown intersecting the surface 302 at intersection point (shown as $P_1$) and a virtual ray 314B is shown intersecting the surface 302 at intersection point (shown as $P_2$). An angle $\theta_1$ is determined (such as by the computing system 12) between a normal vector (shown as $n_1$) and the virtual ray 314A, with the normal vector $n_1$ originating at the intersection point $P_1$. An angle $\theta_2$ is determined (such as by the computing system 12) between a normal vector (shown as $n_2$) and the virtual ray 314B with the normal vector $n_2$ originating at the intersection point $P_2$. As illustrated, due to the curvature of the surface 302, angle $\theta_2$ is less than angle $\theta_1$ based on the relative positions of intersection points $P_1$ and $P_2$.

In one embodiment, a threshold angle ($\theta_T$) is used to determine if a support structure is to be generated at a particular intersection point. The threshold angle $\theta_T$ can be, for example, 45 degrees, or any other suitable angle. In the illustrated embodiment, angle $\theta_1$ is greater than angle $\theta_T$ and angle $\theta_2$ is less than angle $\theta_T$. As a result, as shown in FIG. 13, it can be determined that a support structure 316B is recommended at intersection point $P_2$ since angle $\theta_2$ is less than angle $\theta_T$. Other factors beyond comparing angle $\theta_2$ angle $\theta_T$ can be considered by the computing system 12 prior to recommending the support structure 316B. Furthermore, comparing a threshold angle to an angle formed by (1) a vector that is normal to a model's surface and (2) a virtual ray is merely one non-limiting example of determining which intersection points can (at least initially) be provided with support structures.

Figure 14A:
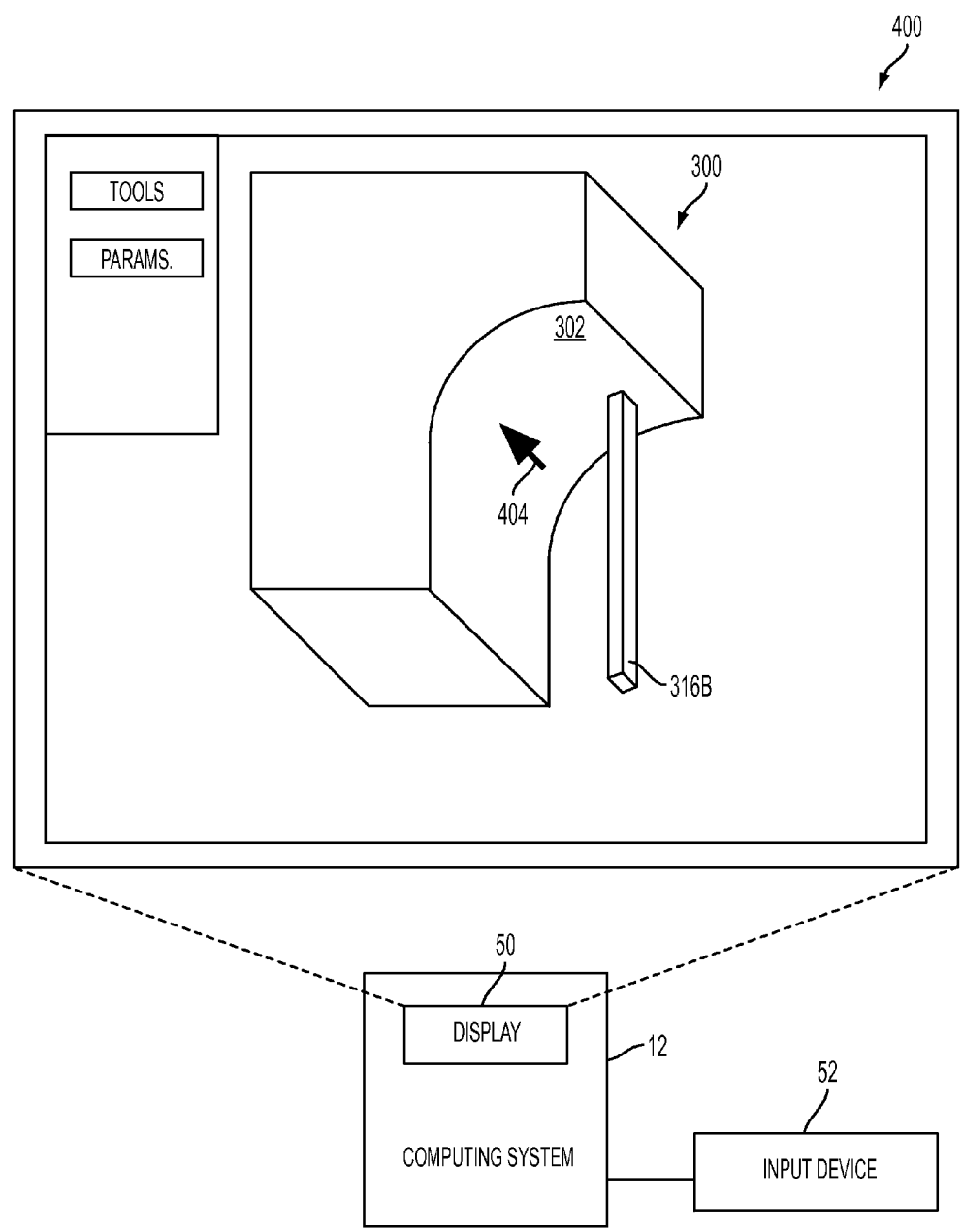
FIGS. 14A-14E depict an example graphical user interface displayed by a computing system.
Figure 14B:
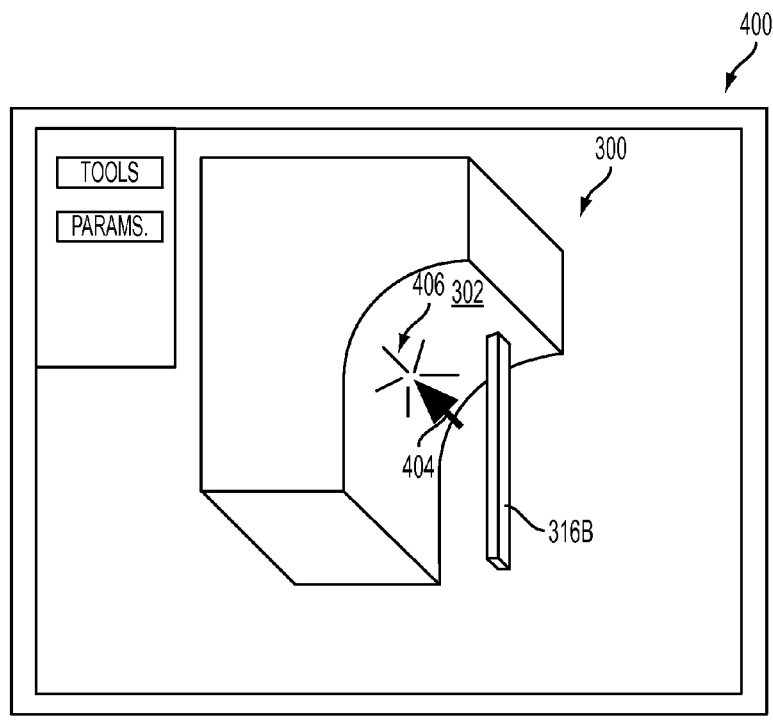
Figure 14C:
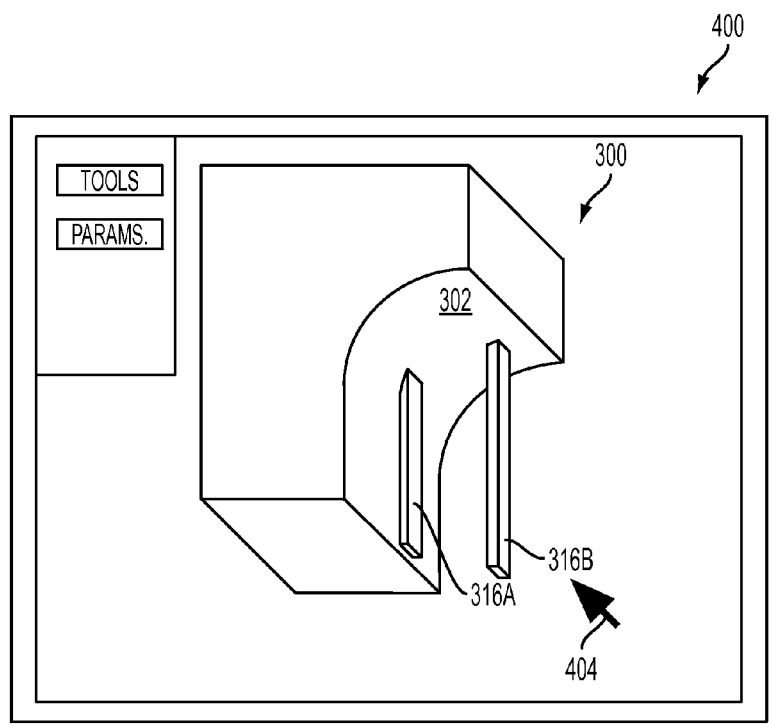
Figure 14D:
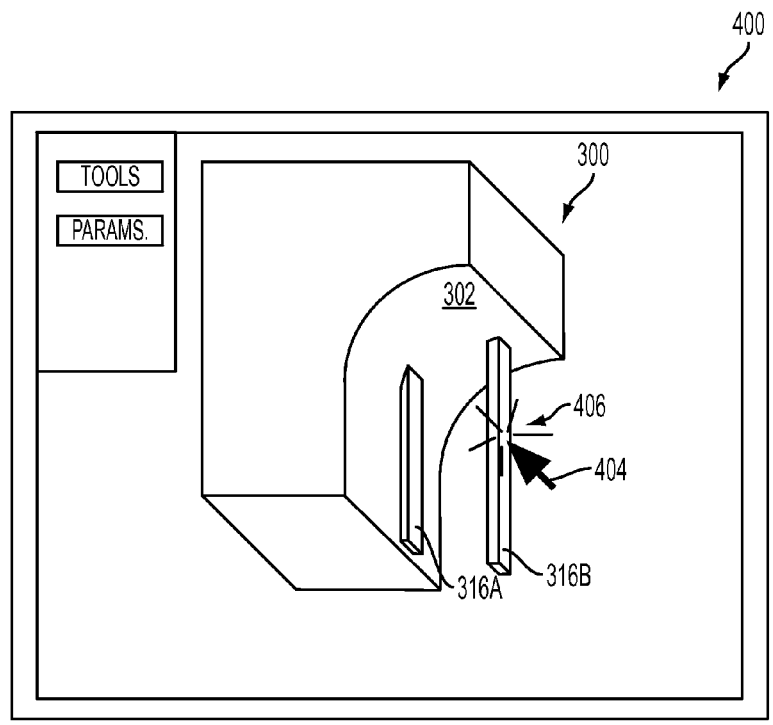
Figure 14E:
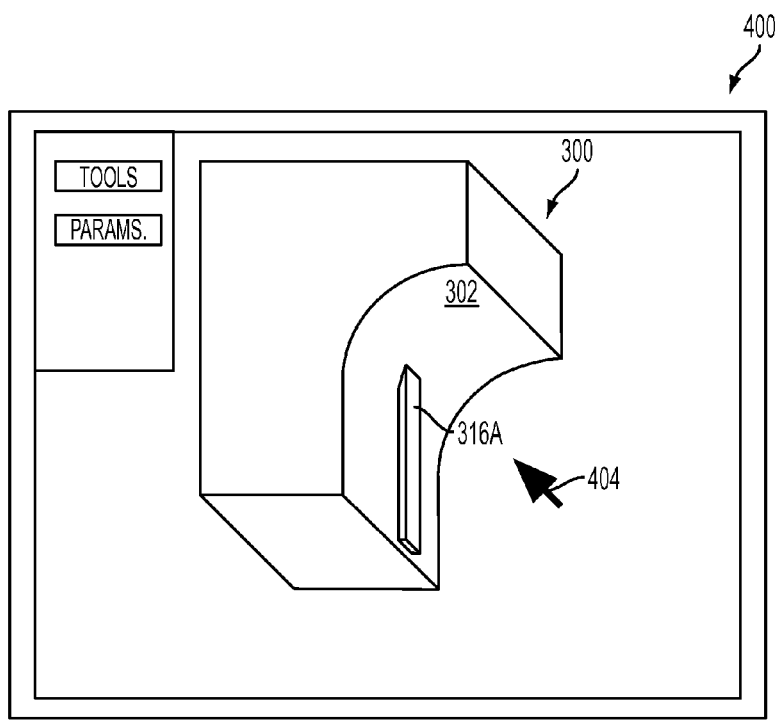

FIG. 14A-14E depict the 3D model 300 presented on an example graphical user interface 400 displayed on a display 50 of a computing system 12. As is to be appreciated, the graphical user interface 400 is simplified for clarify. Referring first to FIG. 14A, the 3D model 300 having a support structure 316B generated by the computing system 12 is shown. An input device 52 can be used to control a cursor 404 on the graphical user interface 400. The input device 52 can be any user-controllable device, such as a computer mouse, a touchpad device, a gesture-based device, a voice-controlled device, and so forth. FIG. 14B depicts a user moving the cursor 404 to a point on the surface 302 and providing a user input 406 (shown as mouse click). Referring now to FIG. 14C, upon receiving the user input 406, a support structure 316A is generated proximate to the location identified by the user input 406. Furthermore, user inputs can also be used to remove support structures. FIG. 14D depicts a user moving the cursor 404 to the support structure 316B and providing a user input 406 (shown as mouse click). Upon receiving the user input 406, the support structure 316B can be removed from the 3D model 300, as shown in FIG. 14E. Therefore, through a series of interactions with the input device 52, a user can quickly and conveniently add supporting structures to the 3D model 300 and remove supporting structures from the 3D model 300. Additional alterations can also be made through these interactions, such alterations related to supporting structure sizing, supporting structure grouping, among other alterations.

Figure 15:
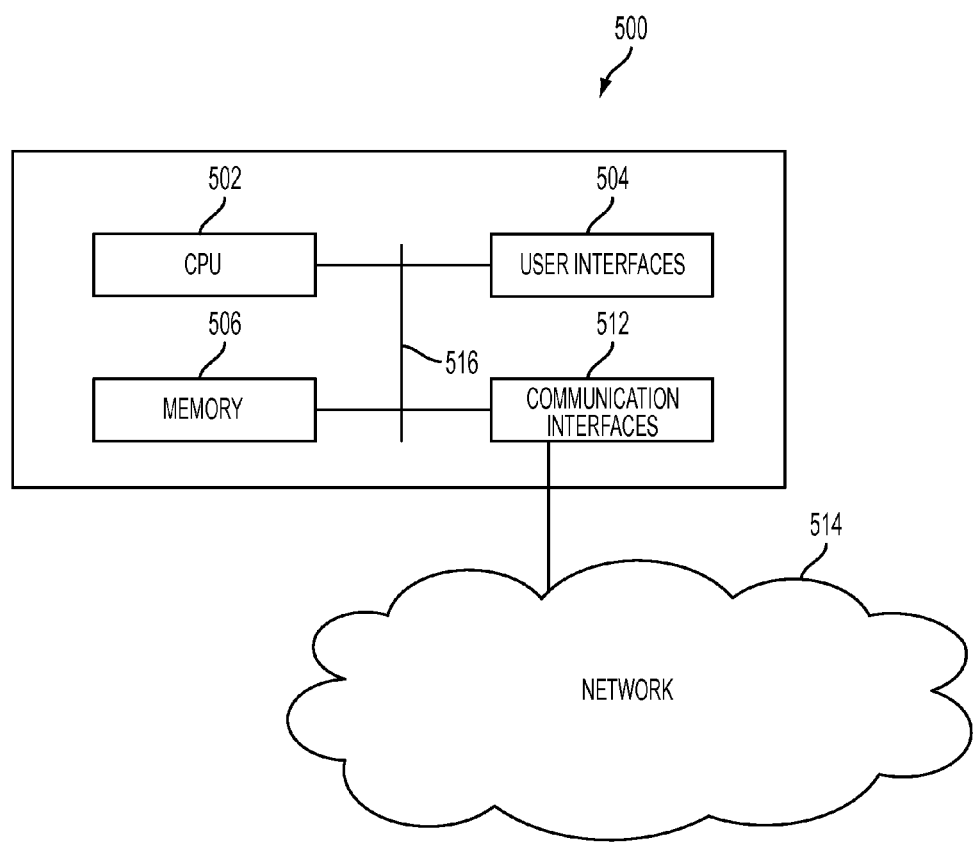
FIG. 15 depicts an example computing device.

The processes described herein can be performed on or between one or more computing devices. Referring now to FIG. 15, an example computing device 500 is presented. A computing device 500 can be a server, a computing device that is integrated with other systems or subsystems, a mobile computing device, a cloud-based computing capability, and so forth. The computing device 500 can be any suitable computing device as would be understood in the art, including without limitation, a custom chip, an embedded processing device, a tablet computing device, a personal data assistant (PDA), a desktop, a laptop, a microcomputer, a minicomputer, a server, a mainframe, or any other suitable programmable device. In various embodiments disclosed herein, a single component can be replaced by multiple components and multiple components can be replaced by a single component to perform a given function or functions. Except where such substitution would not be operative, such substitution is within the intended scope of the embodiments.

The computing device 500 includes a processor 502 that can be any suitable type of processing unit, for example a general purpose central processing unit (CPU), a reduced instruction set computer (RISC), a processor that has a pipeline or multiple processing capability including having multiple cores, a complex instruction set computer (CISC), a digital signal processor (DSP), an application specific integrated circuits (ASIC), a programmable logic devices (PLD), and a field programmable gate array (FPGA), among others. The computing resources can also include distributed computing devices, cloud computing resources, and virtual computing resources in general.

The computing device 500 also includes one or more memories 506, for example read only memory (ROM), random access memory (RAM), cache memory associated with the processor 502, or other memories such as dynamic RAM (DRAM), static ram (SRAM), programmable ROM (PROM), electrically erasable PROM (EEPROM), flash memory, a removable memory card or disk, a solid state drive, and so forth. The computing device 500 also includes storage media such as a storage device that can be configured to have multiple modules, such as magnetic disk drives, floppy drives, tape drives, hard drives, optical drives and media, magneto-optical drives and media, compact disk drives, Compact Disk Read Only Memory (CD-ROM), Compact Disk Recordable (CD-R), Compact Disk Rewriteable (CD-RW), a suitable type of Digital Versatile Disk (DVD) or BluRay disk, and so forth. Storage media such as flash drives, solid state hard drives, redundant array of individual disks (RAID), virtual drives, networked drives and other memory means including storage media on the processor 502, or memories 506 are also contemplated as storage devices. It can be appreciated that such memory can be internal or external with respect to operation of the disclosed embodiments. It can be appreciated that certain portions of the processes described herein can be performed using instructions stored on a computer-readable medium or media that direct a computer system to perform the process steps. Non-transitory computer-readable media, as used herein, comprises all computer-readable media except for transitory, propagating signals.

Network and communication interfaces 512 can be configured to transmit to, or receive data from, other computing devices 500 across a network 514. The network and communication interfaces 512 can be an Ethernet interface, a radio interface, a Universal Serial Bus (USB) interface, or any other suitable communications interface and can include receivers, transmitter, and transceivers. For purposes of clarity, a transceiver can be referred to as a receiver or a transmitter when referring to only the input or only the output functionality of the transceiver. Example communication interfaces 512 can include wired data transmission links such as Ethernet and TCP/IP. The communication interfaces 512 can include wireless protocols for interfacing with private or public networks 514. For example, the network and communication interfaces 512 and protocols can include interfaces for communicating with private wireless networks 514 such as a WiFi network, one of the IEEE 802.11x family of networks, or another suitable wireless network. The network and communication interfaces 512 can include interfaces and protocols for communicating with public wireless networks 514, using for example wireless protocols used by cellular network providers, including Code Division Multiple Access (CDMA) and Global System for Mobile Communications (GSM). A computing device 500 can use network and communication interfaces 512 to communicate with hardware modules such as a database or data store, or one or more servers or other networked computing resources. Data can be encrypted or protected from unauthorized access.

In various configurations, the computing device 500 can include a system bus 516 for interconnecting the various components of the computing device 500, or the computing device 500 can be integrated into one or more chips such as programmable logic device or application specific integrated circuit (ASIC). The system bus 516 can include a memory controller, a local bus, or a peripheral bus for supporting user interfaces 504, and communication interfaces 512. Example user interfaces 504 include keyboards, keypads, gesture or graphical input devices, motion input devices, touchscreen interfaces, one or more displays, audio units, voice recognition units, vibratory devices, computer mice, and any other suitable user interface.

The processor 502 and memory 506 can include nonvolatile memory for storing computer-readable instructions, data, data structures, program modules, code, microcode, and other software components for storing the computer-readable instructions in non-transitory computer-readable mediums in connection with the other hardware components for carrying out the methodologies described herein. Software components can include source code, compiled code, interpreted code, executable code, static code, dynamic code, encrypted code, or any other suitable type of code or computer instructions implemented using any suitable high-level, low-level, object-oriented, visual, compiled, or interpreted programming language.

It is to be understood that the figures and descriptions of the present disclosure have been simplified to illustrate elements that are relevant for a clear understanding of the present disclosure, while eliminating, for purposes of clarity, other elements. Those of ordinary skill in the art will recognize, however, that these sorts of focused discussions would not facilitate a better understanding of the present disclosure, and therefore, a more detailed description of such elements is not provided herein.

Any element expressed herein as a means for performing a specified function is intended to encompass any way of performing that function including, for example, a combination of elements that performs that function. Furthermore the disclosure, as may be defined by such means-plus-function claims, resides in the fact that the functionalities provided by the various recited means are combined and brought together in a manner as defined by the appended claims. Therefore, any means that can provide such functionalities may be considered equivalents to the means shown herein. Moreover, the processes associated with the present embodiments may be executed by programmable equipment, such as computers. Software or other sets of instructions that may be employed to cause programmable equipment to execute the processes may be stored in any storage device, such as, for example, a computer system (non-volatile) memory, an optical disk, magnetic tape, or magnetic disk. Furthermore, some of the processes may be programmed when the computer system is manufactured or via a computer-readable memory medium.

It can also be appreciated that certain process aspects described herein may be performed using instructions stored on a computer-readable memory medium or media that direct a computer or computer system to perform process steps. A computer-readable medium may include, for example, memory devices such as diskettes, compact discs of both read-only and read/write varieties, optical disk drives, and hard disk drives. A non-transitory computer-readable medium may also include memory storage that may be physical, virtual, permanent, temporary, semi-permanent and/or semi-temporary.

These and other embodiments of the systems and methods can be used as would be recognized by those skilled in the art. The above descriptions of various systems and methods are intended to illustrate specific examples and describe certain ways of making and using the systems disclosed and described here. These descriptions are neither intended to be nor should be taken as an exhaustive list of the possible ways in which these systems can be made and used. A number of modifications, including substitutions of systems between or among examples and variations among combinations can be made. Those modifications and variations should be apparent to those of ordinary skill in this area after having read this disclosure.

What is claimed is:

1. A computer-implemented method for generating data for a support structure to be built with a digital manufacturing system, the method comprising:

receiving, by a computing system, a digital representation of a three-dimensional model, the three-dimensional model having a virtual outer surface;

projecting, by the computing system, a plurality of virtual rays toward the virtual outer surface of the three-dimensional model;

determining, by the computing system, an intersection point formed between a projected virtual ray of the plurality of projected virtual rays and the virtual outer surface of the three-dimensional model;

determining, by the computing system, a normal vector extending from the virtual outer surface of the three-dimensional model at the intersection point;

determining, by the computing system, whether the intersection point satisfies a support structure requirement for the intersection point, wherein the support structure requirement for the intersection point is based on an angle formed between the projected virtual ray and the normal vector;

generating, by the computing system, a support structure comprising a plurality of primary support members, wherein a first primary support member of the plurality of primary support members extends from the virtual outer surface of the three-dimensional model at the intersection point to support a first support region of the three-dimensional model when the intersection point satisfies the support structure requirement, wherein a second primary support member of the plurality of primary support members extends from the virtual outer surface of the three-dimensional model to support a second support region of the three-dimensional model, and wherein the support structure and the plurality of primary support members are different from the plurality of virtual rays projected toward the virtual outer surface of the three-dimensional model;

graphically displaying, by the computing system, a composite digital model comprising the digital representation of the three-dimensional model and the support structure;

receiving, by the computing system, a first user modification to the support structure, wherein the first user modification comprises a change to a location of one or more of the plurality of primary support members, a change to a size of one or more of the plurality of primary support members, a change to shape of one or more of the plurality of primary support members, a change to a total number of the plurality of primary support members, or any combination thereof;

subsequent to the first user modification, bundling, by the computing system and based on proximity, the first primary support member and the second primary support member to form a unitary support member, wherein the unitary support member supports the first and second support regions of the three-dimensional model; and graphically displaying, by the computing system, the composite digital model including the first user modification to the support structure.

2. The computer-implemented of claim 1, further comprising:
determining, by the computing system, tool path instructions to build the three-dimensional model and the support structure, wherein the support structure comprises the unitary support member.

3. The computer-implemented of claim 1, further comprising:
receiving, by the computing system, a second user modification to the unitary support member, wherein the second user modification to the unitary support member is any of an ungrouping of the first and second primary support members, a change to a size of the unitary support member, a change to the shape of the unitary support member, and a change to the placement of the unitary support member.

4. The computer-implemented method of claim 1, wherein the projected virtual ray is a first projected virtual ray, the intersection point is a first intersection point, and the normal vector is a first normal vector; and further comprising:
determining, by the computing system, a second intersection point formed between a second projected virtual ray of the plurality of projected virtual rays and the virtual outer surface of the three-dimensional model;
determining, by the computing system, a second normal vector extending from the virtual outer surface of the three-dimensional model at the second intersection point;
determining, by the computing system, whether the second intersection point satisfies the support structure requirement for the second intersection point, wherein the support structure requirement for the second intersection point is based on an angle formed between the second projected virtual ray and the second normal vector; and
wherein the second primary support member extends from the virtual outer surface of the three-dimensional model at the second intersection point when the second intersection point satisfies the support structure requirement.

5. The computer-implemented method of claim 1, further comprising:

transmitting, by the computing system, the composite digital model to a digital manufacturing system.

6. The computer-implemented method of claim 5, wherein the digital manufacturing system is one of a fused deposition modeling (FDM) system and a stereolithography (SLA) system.

7. The computer-implemented method of claim 1, wherein each of the plurality of virtual rays are parallel to one another; and
wherein projecting the plurality of virtual rays toward the virtual outer surface of the three-dimensional model comprises projecting each of the plurality of virtual rays from a virtual plane towards the three-dimensional model.

8. The computer-implemented method of claim 7, wherein a total number of virtual rays projected is based on a ray origin density.

9. The computer-implemented method of claim 8, wherein the ray origin density is greater than about 10 virtual rays per square inch.

10. The computer-implemented method of claim 8, further comprising any of:
receiving, by the computing system, the ray origin density from a user of the computing system, and
determining, by the computing system, the ray origin density based at least partially on a size of the three-dimensional model.

11. The computer-implemented method of claim 1, wherein the intersection point is a first intersection point and the projected virtual ray extends through a second intersection point of the virtual outer surface of the three-dimensional model and intersects the virtual outer surface of the three-dimensional model at a third intersection point.

12. The computer-implemented method of claim 11, further comprising:
determining, by the computing system, whether the third intersection point satisfies the support structure requirement.

13. The computer-implemented method of claim 12, wherein the support structure further comprises one or more secondary support members.

14. The computer-implemented method of claim 13, further comprising:
generating the one or more secondary support members connecting the second intersection point and the third intersection point only when the support structure requirement is satisfied.

15. A method for digital manufacturing, the method comprising:
receiving, by a computing system, a digital representation of a three-dimensional model, the three-dimensional model having a virtual outer surface;
projecting, by the computing system, a plurality of virtual rays toward the virtual outer surface of the three-dimensional model;
determining, by the computing system, an intersection point formed between a projected virtual ray of the plurality of projected virtual rays and the virtual outer surface of the three-dimensional model;
determining, by the computing system, a normal vector extending from the virtual outer surface of the three-dimensional model at the intersection point;
determining, by the computing system, whether the intersection point satisfies a support structure requirement for the intersection point, wherein the support structure requirement for the intersection point is based on an angle formed between the projected virtual ray and the normal vector;

generating, by the computing system, a support structure comprising a plurality of primary support members, each of the plurality of primary support members supports a different support region of the three-dimensional model, wherein a primary support member of the plurality of primary support members extends from the virtual outer surface of the three-dimensional model at the intersection point when the intersection point satisfies the support structure requirement, and wherein the support structure and each of the plurality of primary support members are different from the plurality of virtual rays projected toward the virtual outer surface of the three-dimensional model;

receiving, by the computing system, a user command to alter the support structure, wherein the user command to alter the support structure comprises at least one of a command to remove at least one of the plurality of primary support members or a command to add a primary support member;

subsequent to receiving the user command to alter the support structure, bundling, by the computing system and based on proximity, two or more of the plurality of primary support members into a unitary support member, wherein the unitary support member supports each of the different support regions of the three-dimensional model; and determining, by the computing system, tool path instructions to build the three-dimensional model and the support structure, wherein the support structure comprises the unitary support member.

16. The method of claim 15, further comprising building the three-dimensional model and the support structure with a digital manufacturing system based on the tool path instructions.

17. The method of claim 15, wherein the user command to alter the support structure comprises an identification of a selected point on the virtual outer surface of the three-dimensional model to add the support member.

18. The method of claim 17, wherein the selected point does not satisfy the support structure requirement.

19. The method of claim 15, wherein the user command to alter the support structure comprises at least one of a command to ungroup a group of at least two of the plurality of primary support members bundled together, a command to change a size of the unitary support member, a command to change the shape of the unitary support member, or a command to change the placement of the unitary support member.

20. The method of claim 19, further comprising:
generating, by the computing system, a graphical representation of the digital representation of the three-dimensional model and the support structure; and
updating, by the computing system, the digital representation of the support structure based on user modifications.

21. The method of claim 15, wherein a total number of intersection points is based at least in part on a ray origin density and a size of the three-dimensional model.

22. A digital manufacturing system comprising:
an extrusion head moveable relative to a platen, wherein at least one of the extrusion head and the platen are configured to move in a tool path based on tool path instructions, wherein the tool path is a three-dimensional tool path;

a computing system configured to determine the tool path instructions by:
receiving a digital representation of a three-dimensional model, the three-dimensional model having a virtual outer surface;
projecting a plurality of virtual rays toward the virtual outer surface of the three-dimensional model;
determining an intersection point formed between a projected virtual ray of the plurality of projected virtual rays and the virtual outer surface of the three-dimensional model;
determining a normal vector extending from the virtual outer surface of the three-dimensional model at the intersection point;
determining whether the intersection point satisfies a support structure requirement based on an angle formed between the projected virtual ray and the normal vector;
generating a support structure comprising a plurality of primary support members, each of the plurality of primary support members supports a different support region of the three-dimensional model, wherein a primary support member of the plurality of primary support members extends from the virtual outer surface of the three-dimensional model at the intersection point when the intersection point satisfies the support structure requirement, and wherein the support structure and each of the plurality of primary support members are different from the plurality of virtual rays projected toward the virtual outer surface of the three-dimensional model;
receiving a user modification to at least one of the plurality of primary support members, wherein the user modification to the at least one of the plurality of primary support members is at least one of a grouping of at least two primary support members of the plurality of primary support members, a change to a size of at least one of the plurality of primary support members, a change to the shape of at least one of the plurality of support members, a change to a total number of the plurality of primary support members, and a change to the placement of at least one of the plurality of support members;
subsequent to receiving the user modification, bundling at least two of the plurality of primary support members into a unitary support member based on proximity, wherein the unitary support member supports each of the different support regions of the three-dimensional model;
determining the tool path for manufacturing the three-dimensional model and the support structure, wherein the support structure comprises the unitary support member; and
converting the tool path to tool path instructions for the extrusion head.

23. A computer-implemented method for generating data for a support structure to be built with a digital manufacturing system, the method comprising:
receiving, by a computing system, a digital representation of a three-dimensional model, the three-dimensional model having a virtual outer surface;
projecting, by the computing system, a plurality of virtual rays toward the virtual outer surface of the three-dimensional model;
determining, by the computing system, an intersection point formed between a projected virtual ray of the plurality of projected virtual rays and the virtual outer surface of the three-dimensional model;

determining, by the computing system, a normal vector extending from the virtual outer surface of the three-dimensional model at the intersection point;

determining, by the computing system, whether the intersection point satisfies a support structure requirement for the intersection point, wherein the support structure requirement for the intersection point is based on an angle formed between the projected virtual ray and the normal vector;

generating, by the computing system, a support structure comprising a plurality of primary support members, wherein a first primary support member of the plurality of primary support members extends from the virtual outer surface of the three-dimensional model at the intersection point to support a first support region of the three-dimensional model when the intersection point satisfies the support structure requirement, wherein a second primary support member of the plurality of primary support members extends from the virtual outer surface of the three-dimensional model to support a second support region of the three-dimensional model, wherein a third primary support member of the plurality of primary support members extends from the virtual outer surface of the three-dimensional model to support a third support region of the three-dimensional model, wherein the support structure and each of the plurality of primary support members are different from the plurality of virtual rays projected toward the virtual outer surface of the three-dimensional model, and wherein the first primary support member, the second primary support member, and the third primary support member are each parallel to one another;

graphically displaying, by the computing system, a composite digital model comprising the digital representation of the three-dimensional model and the support structure;

receiving, by the computing system, a first user modification to the support structure, wherein the first user modification comprises a removal of the first primary support member;

graphically displaying, by the computing system, the composite digital model subsequent to the first user modification to the support structure;

receiving, by the computing system, a second user modification to the support structure, wherein the second user modification comprises an addition of a fourth primary support member that extends from the virtual outer surface of the three-dimensional model to support a fourth support region of the three-dimensional model;

graphically displaying, by the computing system, the composite digital model subsequent to the second user modification to the support structure;

receiving, by the computing system, a third user modification to the support structure, wherein the third user modification comprises a change to the size of the third primary support member;

graphically displaying, by the computing system, the composite digital model subsequent to the third user modification to the support structure;

subsequent to the third user modification, bundling, by the computing system and based on proximity, the second primary support member, the third primary support member, and the fourth primary support member to form a unitary support member, wherein the unitary support member supports the second, third, and fourth support regions of the three-dimensional model; and determining, by the computing system, tool path instructions to build the composite digital model subsequent to the third user modification to the support structure.

* * * * *